US010395893B2

(12) United States Patent
Hammond, IV et al.

(10) Patent No.: US 10,395,893 B2
(45) Date of Patent: Aug. 27, 2019

(54) DUAL-FEED TUNABLE PLASMA SOURCE

(71) Applicant: Applied Materials, Inc., Santa Clara, CA (US)

(72) Inventors: Edward P. Hammond, IV, Hillsborough, CA (US); Tsutomu Tanaka, Santa Clara, CA (US); Anantha K. Subramani, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/413,910

(22) Filed: Jan. 24, 2017

(65) Prior Publication Data

US 2017/0213702 A1    Jul. 27, 2017

Related U.S. Application Data

(60) Provisional application No. 62/286,407, filed on Jan. 24, 2016, provisional application No. 62/341,597, filed on May 25, 2016.

(51) Int. Cl.
| | |
|---|---|
| *C23C 16/00* | (2006.01) |
| *H01L 21/00* | (2006.01) |
| *H01J 37/32* | (2006.01) |
| *H01L 21/67* | (2006.01) |
| *C23C 16/455* | (2006.01) |
| *C23C 16/50* | (2006.01) |
| *H01L 21/3065* | (2006.01) |
| *H01L 21/311* | (2006.01) |
| *H01L 21/3213* | (2006.01) |

(52) U.S. Cl.
CPC .. *H01J 37/32091* (2013.01); *C23C 16/45525* (2013.01); *C23C 16/50* (2013.01); *H01J 37/3244* (2013.01); *H01J 37/32082* (2013.01); *H01J 37/32174* (2013.01); *H01J 37/32532* (2013.01); *H01J 37/32577* (2013.01); *H01L 21/67069* (2013.01); *H01J 2237/334* (2013.01); *H01L 21/3065* (2013.01); *H01L 21/31116* (2013.01); *H01L 21/31138* (2013.01); *H01L 21/32136* (2013.01)

(58) Field of Classification Search
CPC ................................. H01J 37/32577
USPC .................................... 156/345.44
See application file for complete search history.

(56) References Cited

U.S. PATENT DOCUMENTS

| | | | |
|---|---|---|---|
| 6,353,201 B1 | 3/2002 | Yamakoshi et al. | |
| 6,451,160 B1 * | 9/2002 | Nakano ............. | H01J 37/32082 118/723 E |

(Continued)

FOREIGN PATENT DOCUMENTS

JP    2012074464 A    4/2012

OTHER PUBLICATIONS

PCT International Preliminary Report on Patentability in PCT/US2017/014694 dated Aug. 2, 2018, 6 pages.

*Primary Examiner* — Parviz Hassanzadeh
*Assistant Examiner* — Michelle Crowell
(74) *Attorney, Agent, or Firm* — Servilla Whitney LLC (57) ABSTRACT

A plasma source assembly for use with a processing chamber includes an inner RF feed connected to the inner edge of the electrode and an outer RF feed connected to the outer edge of the electrode. A capacitor is connected between the inner edge of the electrode and electrical ground to modulate the voltage of across the length of the electrode.

18 Claims, 9 Drawing Sheets

(56) References Cited

U.S. PATENT DOCUMENTS

| | | | |
|---|---|---|---|
| 7,520,244 B2* | 4/2009 | Yamagishi | C23C 16/36 |
| | | | 118/723 E |
| 2005/0031796 A1 | 2/2005 | Wu et al. | |
| 2009/0025879 A1 | 1/2009 | Rauf et al. | |
| 2009/0159423 A1* | 6/2009 | Kudela | H01J 37/32091 |
| | | | 204/157.44 |
| 2009/0202741 A1* | 8/2009 | Stimson | H01J 37/32174 |
| | | | 427/569 |
| 2010/0043974 A1* | 2/2010 | Koshiishi | H01J 37/32082 |
| | | | 156/345.33 |
| 2011/0135844 A1 | 6/2011 | Sorensen et al. | |
| 2011/0192349 A1* | 8/2011 | Hammond, IV | C23C 16/509 |
| | | | 118/723 E |
| 2012/0073756 A1 | 3/2012 | Yamazawa | |
| 2015/0048739 A1* | 2/2015 | Forster | H01J 37/32357 |
| | | | 315/111.21 |
| 2015/0262792 A1* | 9/2015 | Bera | H01J 37/32128 |
| | | | 315/111.21 |
| 2017/0076917 A1* | 3/2017 | Yudovsky | H01J 37/32651 |
| 2017/0148626 A1* | 5/2017 | Subramani | H01L 21/0228 |

\* cited by examiner

DUAL-FEED TUNABLE PLASMA SOURCE

CROSS-REFERENCE TO RELATED APPLICATIONS

This application claims priority to U.S. Provisional Application No. 62/286,407, filed Jan. 24, 2016 and U.S. Provisional Application No. 62/341,597, filed May 25, 2016, the entire disclosures of which are hereby incorporated by reference herein.

FIELD

Embodiments of the disclosure generally relate to an apparatus for processing substrates. More particularly, embodiments of the disclosure relate to modular capacitively coupled plasma sources for use with processing chambers like batch processors.

BACKGROUND

Semiconductor device formation is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

Some ALD systems, especially spatial ALD systems with rotating substrate platens, benefit from a modular plasma source, i.e., a source that can be easily inserted into the system. The plasma source consists of a volume where plasma is generated, and a way to expose a workpiece to a flux of charged particles and active chemical radical species.

Some processing platforms use rotating carousels that hold multiple wafers to deposit thin films. The volume above the wafers may be partitioned into regions that are isolated from each other by a gas curtain. Each section can apply separate gas to adhere to the wafer surface and grow the film. Due to the rotation, gas flow within each section may be adjusted so that the wafer regions at different radii on the carousel receive similar treatments. Plasma sources are meant to perform in the same way; however, existing plasma source designs provide different treatments at the inner diameter of the carousel than at the outer diameter.

Therefore, there is a need in the art for plasma sources which provide increased uniformity between the inner diameter and outer diameter of the wafer in a batch processing chamber.

SUMMARY

One or more embodiments of the disclosure are directed to a plasma source assembly comprising a housing with a gas inlet and a front face defining a flow path. The gas inlet allows a flow of gas to move along the flow path to pass through the housing and out an opening in the front face. An RF hot electrode is within the housing. The RF hot electrode has an inner peripheral end and an outer peripheral end. An outer RF feed is connected to the RF hot electrode near the outer peripheral end. An inner RF feed is connected to the RF hot electrode near the inner peripheral end and has a capacitor between the inner RF feed and electrical ground.

Additional embodiments of the disclosure are directed to plasma source assemblies comprising a wedge-shaped housing having a gas inlet and a front face defining a flow path. The gas inlet allows a flow of gas to move along the flow path to pass through the housing and out an opening in the front face. The wedge-shaped housing has a narrower width at the inner peripheral edge than at the outer peripheral edge. An RF hot electrode is within the housing. The RF hot electrode has an inner peripheral end and an outer peripheral end. A coaxial RF feed has an inner conductor and an outer conductor separated by an insulator. An outer RF feed is connected to one of the inner conductor and the outer conductor and to the RF hot electrode near the outer peripheral end. An inner RF feed is connected to the other of the inner conductor and outer conductor and to the RF hot electrode near the inner peripheral end. The inner RF feed has a capacitor between the inner RF feed and electrical ground and a match circuit between the capacitor and electrical ground.

Further embodiments of the disclosure are directed to methods of processing a substrate. The method comprises exposing the substrate to a plasma source assembly with a housing with an RF hot electrode therein, an outer RF feed connected to an outer peripheral edge of the RF hot electrode and an inner RF feed connected to an inner peripheral edge of the RF hot electrode. The inner RF feed has a variable capacitor between the RF hot electrode and electrical ground. The capacitance value of the variable capacitor is modulated to smooth variations in plasma power along a radial direction.

BRIEF DESCRIPTION OF THE DRAWINGS

So that the manner in which the above recited features of embodiments of the disclosure can be understood in detail, a more particular description of embodiments of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure provide a substrate processing system for continuous substrate deposition to maximize throughput and improve processing efficiency. The substrate processing system can also be used for pre-deposition and post-deposition plasma treatments.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

As used in this specification and the appended claims, the term "reduced pressure" means a pressure less than about 100 Torr, or less than about 75 Torr, or less than about 50 Torr, or less than about 25 Torr. For example, "medium pressure" defined as in the range of about 1 Torr to about 25 Torr is reduced pressure.

Rotating platen chambers are being considered for many applications. In such a chamber, one or more wafers are placed on a rotating holder ("platen"). As the platen rotates, the wafers move between various processing areas. For example, in ALD, the processing areas would expose the wafer to precursors and reactants. In addition, plasma exposure may be used as a reactant or to treat the film or the substrate surface for enhanced film growth or to modify film properties. Some embodiments of the disclosure provide for uniform deposition and post-treatment (e.g., densification) of ALD films when using a rotating platen ALD chamber.

Rotating platen ALD chambers can deposit films by traditional time-domain processes where the entire wafer is exposed to a first gas, purged and then exposed to the second gas, or by spatial ALD where portions of the wafer are exposed to the first gas and portions are exposed to the second gas and the movement of the wafer through these gas streams deposits the layer.

As used in this specification and the appended claims, the terms "pie-shaped" and "wedge-shaped" are used interchangeably to describe a body that is a generally circular sector. For example, a wedge-shaped segment may be a fraction of a circle or disc-shaped structure. The inner edge of the pie-shaped segment can come to a point or can be truncated to a flat edge or rounded. The path of the substrates can be perpendicular to the gas ports. In some embodiments, each of the gas injector assemblies comprises a plurality of elongate gas ports which extend in a direction substantially perpendicular to the path traversed by a substrate, where a front edge of the gas ports is substantially parallel to the platen. As used in this specification and the appended claims, the term "substantially perpendicular" means that the general direction of movement of the substrates is along a plane approximately perpendicular (e.g., about 45° to 90°) to the axis of the gas ports. For a wedge-shaped gas port, the axis of the gas port can be considered to be a line defined as the mid-point of the width of the port extending along the length of the port.

Figure 1:
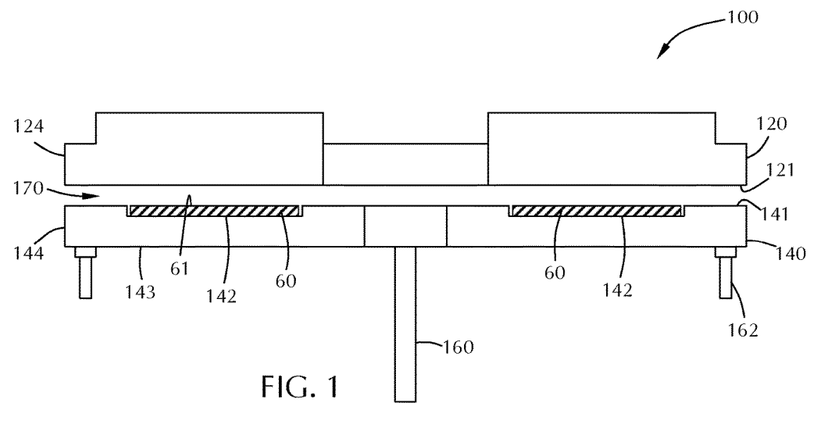
FIG. 1 shows a schematic cross-sectional view of a substrate processing system in accordance with one or more embodiments of the disclosure.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial ALD gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. The plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, forming a layer on the substrate surface.

Figure 2:
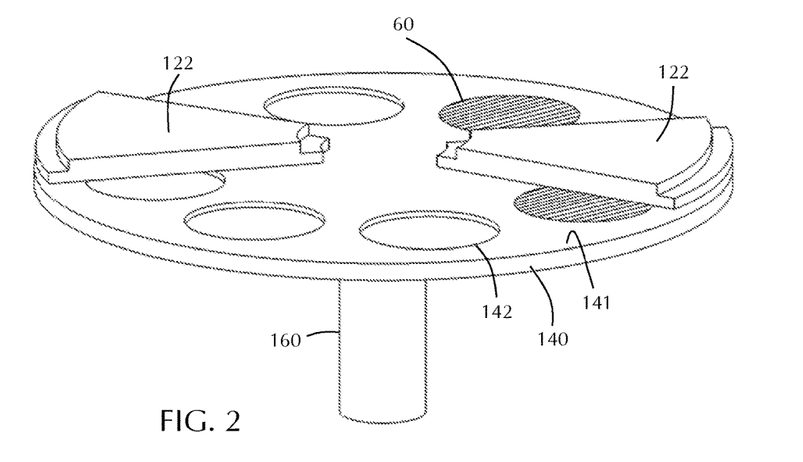
FIG. 2 shows a perspective view of a substrate processing system in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

The susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120. In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
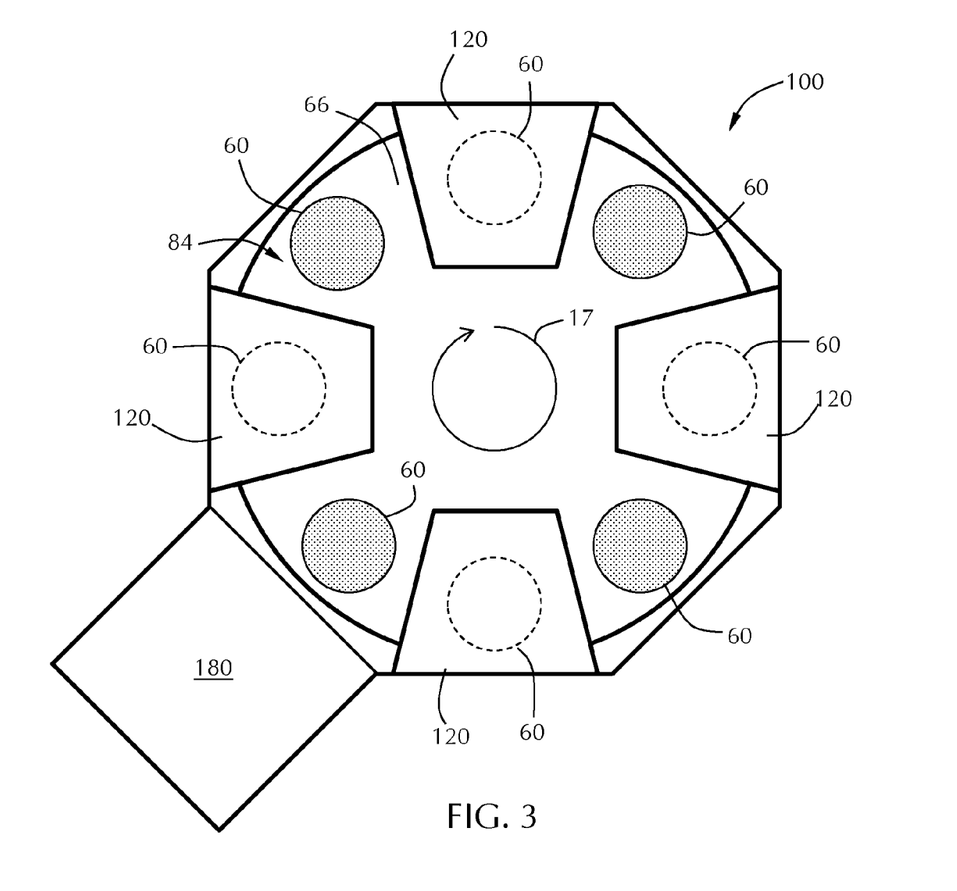
FIG. 3 shows a schematic of a substrate processing system in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. With spatial ALD injectors, a film is deposited on the wafer during movement of the wafer relative to the injector assembly. In some embodiments, the susceptor assembly 140 is rotated in increments that prevent the substrates 60 from stopping beneath the gas distribution assemblies 120. The number of substrates 60 and gas distribution assemblies 120 can be the same or different. In some embodiments, there is the same number of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal, however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the processing chamber 100. A wafer robot may be positioned in the chamber 180 to move the substrate onto the susceptor.

Rotation of the carousel (e.g., the susceptor assembly 140) can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
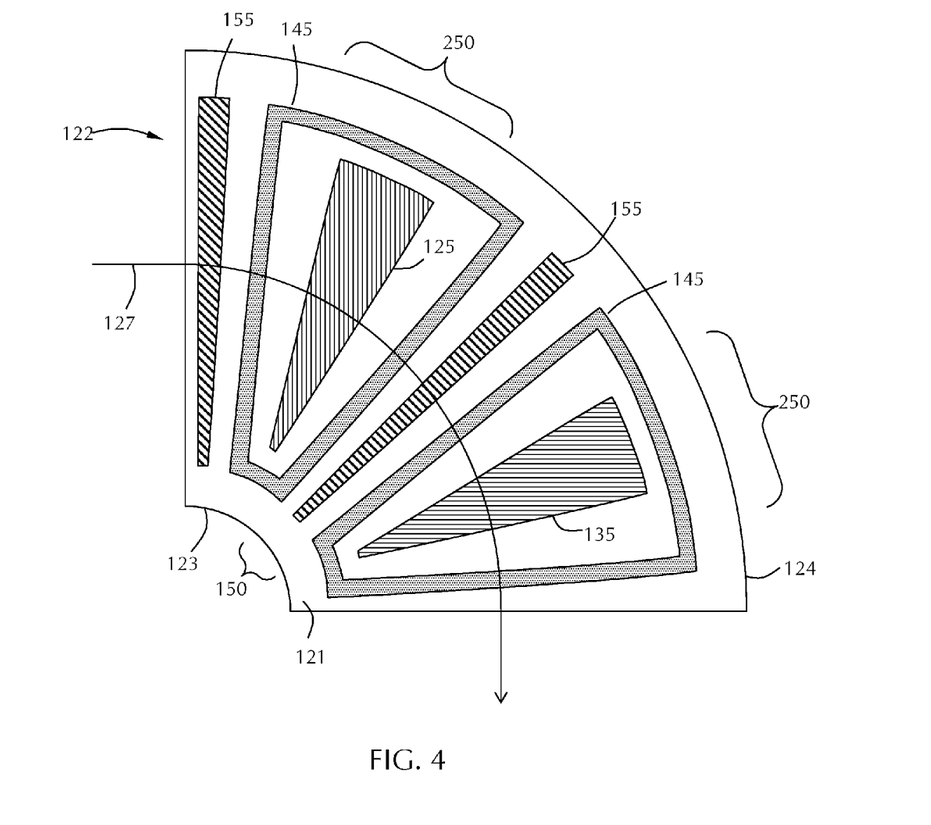
FIG. 4 shows a schematic view of a front of a gas distribution assembly in accordance with one or more embodiment of the disclosure.
Figure 5:
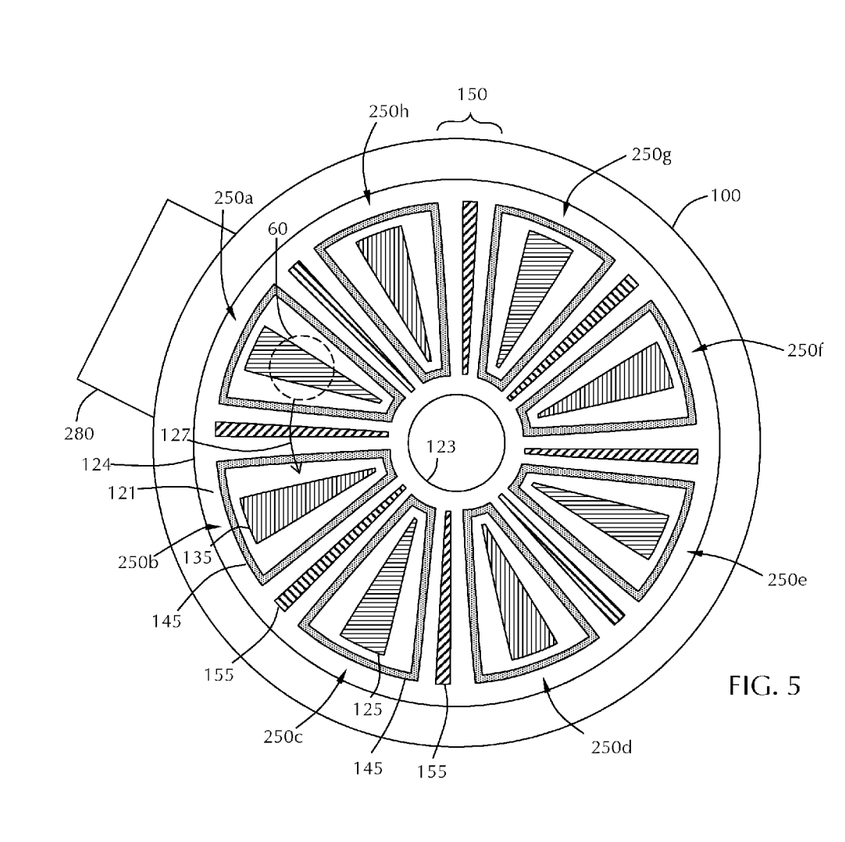
FIG. 5 shows a schematic view of a processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second reactive gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145, 155 extend from an area adjacent the inner peripheral edge 123 toward an area adjacent the outer peripheral edge 124 of the gas distribution assembly 220. The plurality of gas ports shown include a first reactive gas port 125, a second reactive gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second reactive gas port 135 and a vacuum port 145. Thus, at the end of the path 127 shown in FIG. 4, the substrate has been exposed to gas streams from the first reactive gas port 125 and the second reactive gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second reactive gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual reactive gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second reactive gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120 (also referred to as a gas distribution plate). The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first processing region 250a through the eighth processing region 250h, including all processing regions between. For each cycle around the processing chamber, using the gas distribution assembly shown, the substrate 60 will be exposed to four ALD cycles of first reactive gas and second reactive gas.

The conventional ALD sequence in a batch processor, like that of FIG. 5, maintains chemical A and B flow respectively from spatially separated injectors with pump/purge section between. The conventional ALD sequence has a starting and ending pattern which might result in non-uniformity of the deposited film. The inventors have surprisingly discovered that a time based ALD process performed in a spatial ALD batch processing chamber provides a film with higher uniformity. The basic process of exposure to gas A, no reactive gas, gas B, no reactive gas would be to sweep the substrate under the injectors to saturate the surface with chemical A and B respectively to avoid having a starting and ending pattern form in the film. The inventors have surprisingly found that the time based approach is especially beneficial when the target film thickness is thin (e.g., less than 20 ALD cycles), where starting and ending pattern have a significant impact on the within wafer uniformity performance. The inventors have also discovered that the reaction process to create SiCN, SiCO and SiCON films, as described herein, could not be accomplished with a time-domain process. The amount of time used to purge the processing chamber results in the stripping of material from the substrate surface. The stripping does not happen with the spatial ALD process described because the time under the gas curtain is short.

Accordingly, embodiments of the disclosure are directed to processing methods comprising a processing chamber 100 with a plurality of processing regions 250a-250h with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250a-250h. The number of gas curtains is generally equal to or greater than the number of processing regions. For example, if region 250a had no reactive gas flow, but merely served as a loading area, the processing chamber would have seven processing regions and eight gas curtains.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250b through processing region 250h, an inert gas would be flowing into processing region 250a. The inert gas can be flowed through the first reactive gas port 125 or the second reactive gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

Some embodiments of the disclosure are directed to injector modules. While the injector modules are described with respect to a spatial ALD processing chamber, those skilled in the art will understand that the modules are not limited to spatial ALD chambers and can be applicable to any injector situation where increasing gas flow uniformity is useful.

Some embodiments of the disclosure advantageously provide modular plasma sources, i.e. a source that can be easily inserted into and removed from the processing system. Such a source may have all or most of its hardware operating at the same pressure level as the atomic layer deposition process, typically 1-50 Torr. Some embodiments of the disclosure provide plasma sources with improved ion flux across the wafer surface. One or more embodiments advantageously provide blocker plates for plasma sources that are relatively easy to manufacture, using a small number of elongate slotted apertures rather than a large number of small holes. Some embodiments advantageously improve uniformity of the plasma density above the substrate surface using a tilted blocker plate having a variable distance to the substrate surface. One or more embodiments of the disclosure provide a plasma source with improved metal contamination by providing a dielectric sleeve to protect conductive materials from direct plasma exposure.

Figure 6:
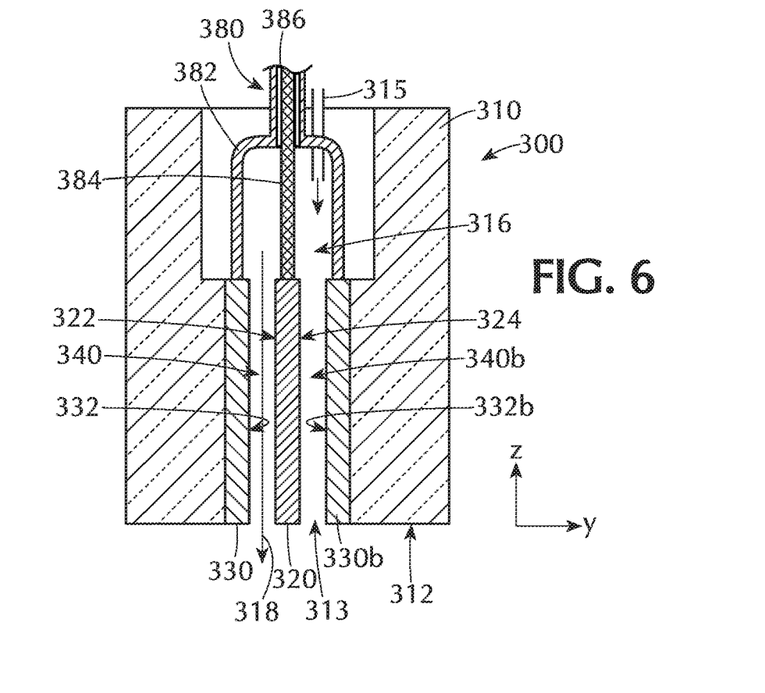
FIG. 6 shows a schematic cross-sectional view of a plasma source assembly in accordance with one or more embodiment of the disclosure.

FIG. 6 shows a cross-section of a plasma source assembly 300 in accordance with one or more embodiment of the disclosure. The plasma source assembly 300 shown in FIG. 6 includes a housing 310 with a gas inlet 315 and a front face 312. The gas inlet 315 allows a flow of gas to move along the flow path 318 through the housing 310 and out an opening 313 in the front face 312. The embodiment shown has a gas inlet 315 illustrated off-center for descriptive purposes, but those skilled in the art will understand that the gas inlet 315 can be centered in the housing 310. Additionally, some embodiments include a plenum 316 to increase the uniformity of the gas flow through the flow path 318.

The plasma source assembly 300 includes an RF hot electrode 320 and at least one return electrode 330. The return electrode 330 is any conductive material that forms a complete circuit with the RF hot electrode 320. Those skilled in the art will understand that the return electrode 330 can provide a pathway for electrons to flow. The term "return" used in this manner means that the electrode is part of the electrical pathway of the plasma components and does not imply a direction for the flow of current or electrons.

Figure 7:
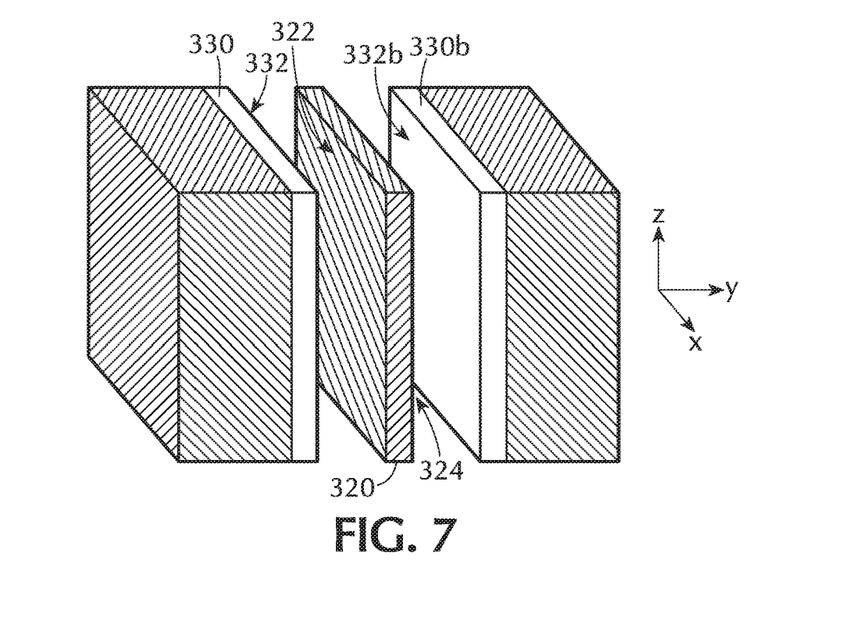
FIG. 7 shows a partial perspective view of a plasma source assembly in accordance with one or more embodiments of the disclosure.
Figure 8:
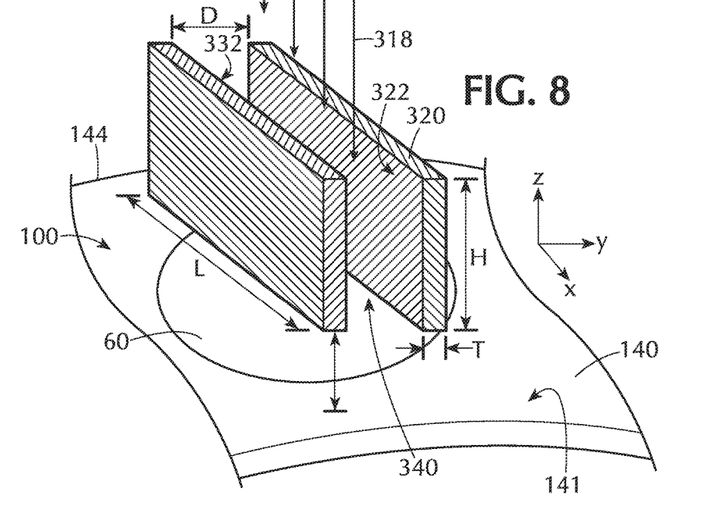
FIG. 8 shows a partial perspective view of a plasma source assembly in accordance with one or more embodiments of the disclosure.

Referring to FIGS. 6 to 8, the RF hot electrode 320 has a first surface 322 and a second surface 324 opposite the first surface 322. FIG. 6 shows a cross-section of a plasma source assembly 300 while FIGS. 7 and 8 show partial perspective views of the electrodes. As used in this regard, the first surface 322 and second surface 324 are on opposite sides of the thickness T of the RF hot electrode 320. The RF hot electrode 320 is a generally shaped as a rectangular prism with a height H, thickness T and length L. The RF hot electrode 320 has a first surface 322 oriented substantially parallel to the flow path 318. As used in this regard, the term "substantially parallel" means that the surface is within ±10° of parallel (defined as 0°).

The return electrode 330 is similarly shaped to the RF hot electrode 320. The return electrode has a first surface 332 that is oriented substantially parallel to the flow path 318. The first surface 332 of the return electrode 330 is spaced from the first surface 322 of the RF hot electrode 320 to form a gap 340.

The return electrode 330,330b can be any suitable material including, but not limited to, aluminum, stainless steel and copper. The return electrode 330, 330b can have any suitable electrical characteristics. In some embodiments, the return electrode 330, 330b is a ground electrode. A ground electrode is any conductive material in electrical contact with electrical ground.

In some embodiments, the return electrode 330, 330b is a powered electrode different from the RF hot electrode 320. As used in this manner, "different from the RF hot electrode" means that the electrical properties or potential are different from the RF hot electrode. For example, the driving power of the generated plasma may be tuned in a push-pull manner from a single source using a phase shifter to minimize interaction with the wafer. In embodiments of this sort, the RF hot electrode 320 may be, for example, 180° out of phase with the return electrode 330.

As shown in FIG. 7, some embodiments of the plasma source assembly further comprise a second return electrode 330b. The second return electrode 330b has a first surface 332b which is oriented substantially parallel to the flow path 318. The first surface 332b of the second return electrode 330b is spaced from a second surface 324 of the RF hot electrode 320 to form a gap 340b. The gap 340 and gap 340b can have the same or different dimensions. In some embodiments, the gap 340, 340b between the RF hot electrode 320 and the return electrode 330, 330b is in the range of about 4 mm to about 15 mm, or in the range of about 5 mm to about 14 mm, or in the range of about 7 mm to about 13 mm, or in the range of about 9 mm to about 12 mm, or about 11 mm.

Some embodiments of the disclosure advantageously provide a tunable plasma source to adjust the treatment at the outer diameter of the carousel versus the inner diameter of the carousel. One or more embodiments of the disclosure advantageously provide plasma sources with dual RF feeds with a variable node in the measured voltage. Some embodiments advantageously provide tunable plasma sources that are independent of RF frequency.

Figure 9:
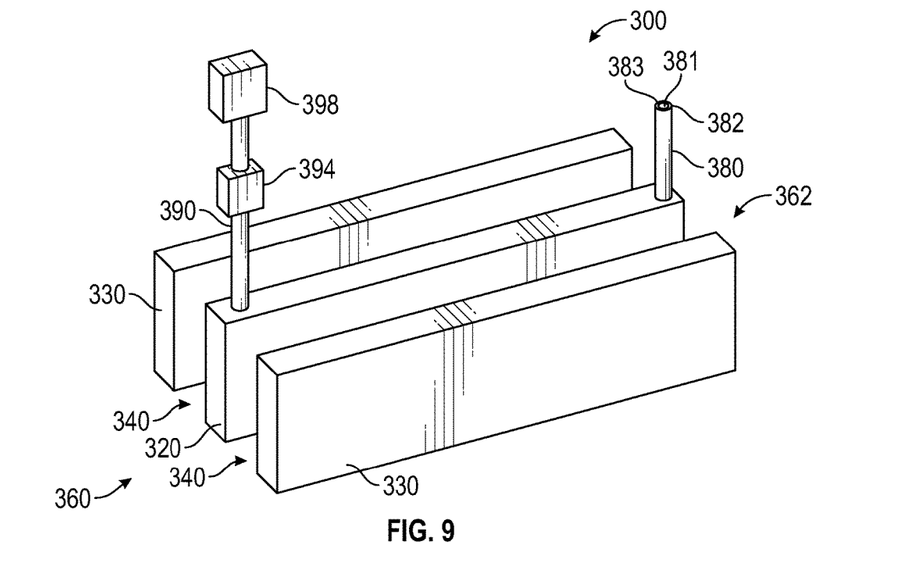
FIG. 9 shows a perspective view of a plasma source assembly in accordance with one or more embodiments of the disclosure.

FIG. 9 shows an embodiment of the disclosure in which there is one RF hot electrode 320 with a return electrode 330 on either side of the RF hot electrode 320. The return electrodes 330 are spaced a distance from the RF hot electrode 320 to form a gap 340. The gap 340 on either side of the RF hot electrode 320 can have the same dimension or different dimensions. The gap 340 can be uniform along the length of the RF hot electrode 320 extending from the inner diameter end 360 to the outer diameter end 362. While FIG. 9 shows a vertical plasma source, those skilled in the art will understand that the various embodiments of the disclosure are not limited to vertical sources.

An outer RF feed 380 is connected to the RF hot electrode 320 near the outer diameter end 362. The outer RF feed 380 can be a coaxial RF feed with an inner conductor 381 and an outer conductor 382 separated by an insulator 383. One of the inner conductor 381 and the outer conductor 382 can provide power to the RF hot electrode 320 and the other of the inner conductor 381 and the outer conductor 382 can be connected to electrical ground.

An inner RF feed 390 is connected to the RF hot electrode 320 near the inner diameter end 360. The inner RF feed 390 has a capacitor 394. The capacitor 394 can be of a fixed capacitance or can be a variable capacitor. A variable capacitor can be manually adjusted or controlled by an electronic feedback circuit to provide real-time adjustment to the capacitance. In some embodiments, the outer RF feed 380 provides power to the RF hot electrode 320 and the inner RF feed 390 provides a return path for the power.

Without being bound by any particular theory of operation, it is believed that the use of a capacitor 394 on the inner RF feed 390 shifts the RF wavelength so that a node (where voltage=0) appears close to the inner diameter end 360 of the plasma source 300. A lower voltage amplitude may result in less plasma generation at the inner diameter of the plasma source 300. Some embodiments include a match circuit 398 between the capacitor 394 and electrical ground.

Figure 10:
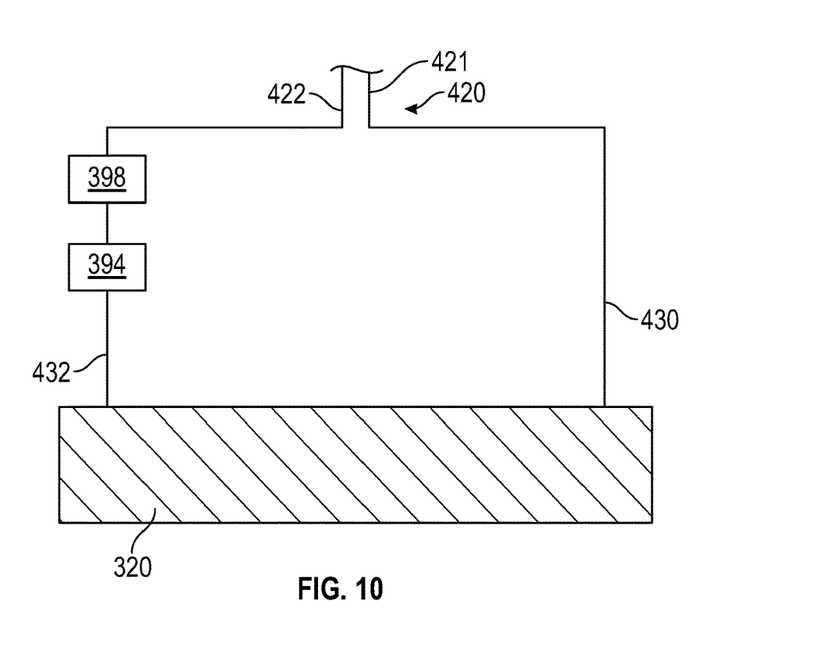
FIG. 10 shows a schematic of a plasma source assembly in accordance with one or more embodiments of the disclosure.

FIG. 10 shows a schematic of an RF hot electrode 320 with a single RF feed 420. The RF feed 420 splits into outer RF feed 430 and inner RF feed 432. The outer RF feed 430 of some embodiments provides power to the RF hot electrode 320. The inner RF feed 432 connects the RF hot electrode 320 to ground through a capacitor 394 and match circuit 398. The RF feed 420 can be a coaxial cable with an inner conductor 421 and an outer conductor 422 separated by an insulator.

In some embodiments, both the outer RF feed 430 and the inner RF feed 432 supply power to the RF hot electrode 320. A separate conductor (not shown) connects the RF hot electrode 320 to ground through an optional match circuit and an optional capacitor.

Figure 11:
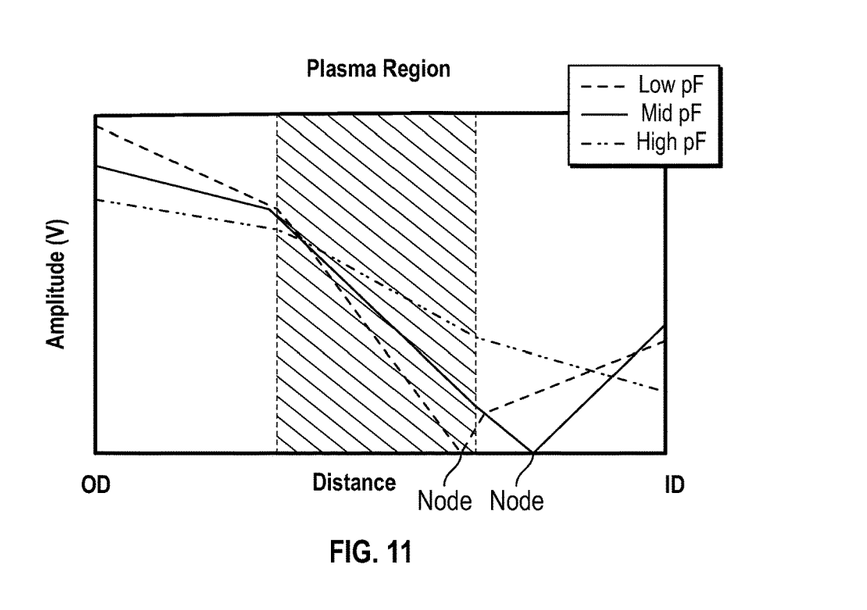
FIG. 11 shows a graph of voltage amplitude as a function of distance along the electrode path in accordance with one or more embodiments of the disclosure.

FIG. 11 shows a representative graph of the voltage amplitude as a function of position along the distance between the outer diameter and inner diameter. The plasma generation region is the portion of the plasma assembly where the plasma is ignited. The portions before and after the plasma region are representative of the electrical connections. Three lines are graphed showing the relative effect of the capacitance on the voltage profile. For any given frequency, the smaller capacitors (low pF) illustrate a larger slope in the plasma region than the larger capacitor (high pF). The decrease in voltage before and after the plasma region may be due, in part, to losses in the transmission line. The amplitude is an absolute value of the voltage so that a node exists where the amplitude crosses the zero voltage line. The position of the node can be adjusted by changing the value of the capacitance. In the graph shown, the low pF capacitor has a node close to the inner diameter of the plasma region. In some embodiments, the voltage across the plasma region is substantially linear; meaning that the line has a coefficient of determination ($r^2$) greater than 0.9. In some embodiments, the voltage across the plasma region is non-linear and the power dissipation over the plasma region is substantially linear (e.g., $r^2 > 0.9$).

The capacitor value can be chosen based on a variety of factors including, but not limited to, the size of the wafer, the location of the wafer on the susceptor, the size of the RF hot electrode, the gas composition and the frequency. A capacitor can be used regardless of the plasma frequency or power. The value of the capacitor may differ for different plasma frequencies or powers. In some embodiments, the value of the capacitor is chosen by selecting a capacitance, performing a deposition and etching the film to evaluate the etch rate. The value of the capacitor can be changed based on the empirical results to deposit a film with a more uniform etch rate.

In some embodiments, the value of the capacitor is modulated during processing. For example, the capacitance can be modulated to counteract a wavy or striated film pattern resulting from plasma non-uniformity. In some embodiments, the capacitance is varied to smooth film variations occurring in the radial direction. The capacitance can be actively varied between a first capacitance C1 and a second capacitance C2 during processing. In some embodiments, the magnitude of the distance between C1 and C2 is within 10% of the capacitance. For example, a 100 pF capacitance may be actively varied between about 90 pF and about 110 pF. In some embodiments, the magnitude of the variation is within 20% of the target capacitance, 15% of the target capacitance, 10% of the target capacitance or 5% of the target capacitance. The time scale of the active variation can be greater than about 0.5 seconds to about 60 seconds.

Examples

Figure 12:
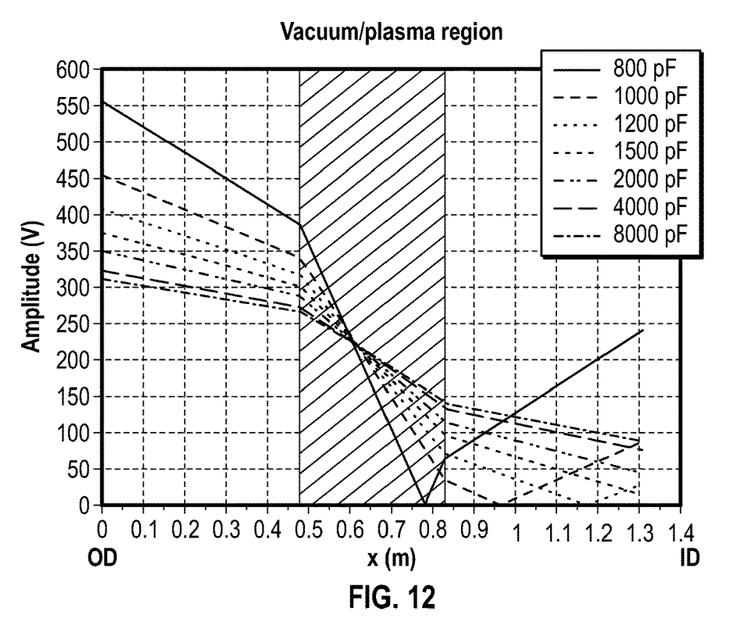
FIG. 12 shows a graph of voltage amplitude as a function of distance along the electrode path in accordance with one or more embodiments of the disclosure.

FIG. 12 shows a graph of the voltage amplitude as a function of the position along the electrode path for a 13 MHz, 100 W plasma. The capacitance values ranged from 800 pF to 8000 pF. A node (voltage=0) can be seen near the inner diameter of the plasma region with the lower capacitance values.

Figure 13:
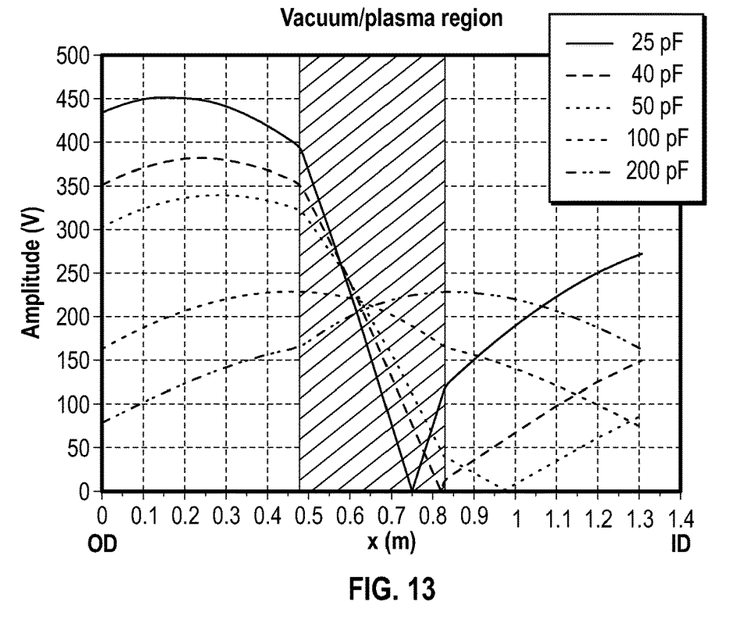
FIG. 13 shows a graph of voltage amplitude as a function of distance along the electrode path in accordance with one or more embodiment of the disclosure.

FIG. 13 shows a graph of the voltage amplitude as a function of position along the electrode path for a 60 MHz, 100 W plasma. The capacitance values were lower than those of the 13 MHz plasma in FIG. 12 and ranged from 25 pF to 200 pF. The voltage profile was tuned using the different capacitor values but did not result in a flat profile across the entire path.

Figure 14:
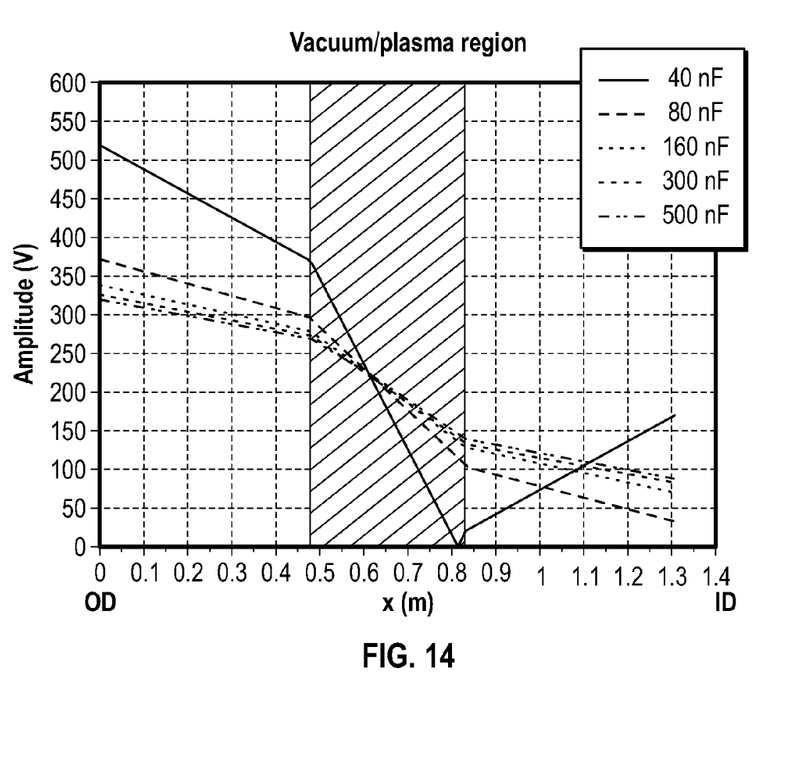
FIG. 14 shows a graph of voltage amplitude as a function of distance along the electrode path in accordance with one or more embodiments of the disclosure.

FIG. 14 shows a graph of the voltage amplitude as a function of position along the electrode path for a 2 MHz, 100 W plasma. The capacitance values used to tune the profile were higher than those of the 13 MHz plasma in FIG. 12. The capacitances ranged from 40 nF to 500 nF.

The frequency of the plasma may be tuned depending on the specific reactive species being used. Suitable frequencies include, but are not limited to, 400 kHz, 2 MHz, 13.56 MHz, 27 MHz, 40 MHz, 60 MHz and 100 MHz.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present disclosure, other and further embodiments of the disclosure may be devised without departing from the basic scope thereof, and the scope thereof is determined by the claims that follow.

What is claimed is:

1. A plasma source assembly comprising:
   a housing having a gas inlet and a front face defining a flow path, the gas inlet allowing a flow of gas to move along the flow path to pass through the housing and out an opening in the front face;
   an RF hot electrode within the housing, the RF hot electrode having an inner peripheral end and an outer peripheral end;
   only one outer RF feed connected to the RF hot electrode near the outer peripheral end; and
   only one inner RF feed connected to the RF hot electrode near the inner peripheral end, the inner RF feed having a variable capacitor between the inner RF feed and electrical ground,
   wherein the outer RF feed provides power to the RF hot electrode and the inner RF feed provides a return path for the power, wherein the housing and RF hot electrode are wedge-shaped with a narrower width at the inner peripheral edge than at the outer peripheral edge.

2. The plasma source assembly of claim 1, wherein the outer RF feed and the inner RF feed are split from a coaxial RF feed.

3. The plasma source assembly of claim 2, wherein the outer RF feed is connected to one of an inner conductor and an outer conductor of the coaxial RF feed and the inner RF feed is connected to the other of the inner conductor and the outer conductor of the coaxial RF feed.

4. The plasma source assembly of claim 3, wherein the inner conductor and the outer conductor are separated by an insulator.

5. The plasma source assembly of claim 1, wherein the capacitor is effective to modulate amplitude of a plasma voltage across a length of the RF hot electrode.

6. The plasma source assembly of claim 5, wherein the amplitude modulation is substantially linear from the outer peripheral end to the inner peripheral end of the RF hot electrode.

7. The plasma source assembly of claim 5, wherein the plasma voltage has a node near the inner peripheral end of the RF hot electrode.

8. The plasma source assembly of claim 5, wherein a power dissipation is substantially linear from the outer peripheral end to the inner peripheral end of the RF hot electrode.

9. The plasma source assembly of claim 1, wherein the variable capacitor has a value that is modulated during processing between a first capacitance and a second capacitance.

10. The plasma source assembly of claim 9, wherein a magnitude of the difference between the first capacitance and the second capacitance is within 10% absolute of a target capacitance.

11. The plasma source assembly of claim 1, further comprising a match circuit between the capacitor and electrical ground.

12. A plasma source assembly comprising:
- a wedge-shaped housing having a gas inlet and a front face defining a flow path, the gas inlet allowing a flow of gas to move along the flow path to pass through the housing and out an opening in the front face, the wedge-shaped housing having a narrower width at the inner peripheral edge than at the outer peripheral edge;
- an RF hot electrode within the housing, the RF hot electrode having an inner peripheral end and an outer peripheral end;
- a coaxial RF feed having an inner conductor and an outer conductor separated by an insulator;
- only one outer RF feed connected to one of the inner conductor and the outer conductor and to the RF hot electrode near the outer peripheral end; and
- only one inner RF feed connected to the other of the inner conductor and outer conductor and to the RF hot electrode near the inner peripheral end, the inner RF feed having a variable capacitor between the inner RF feed and electrical ground and a match circuit between the capacitor and electrical ground,
- wherein the outer RF feed provides power to the RF hot electrode and the inner RF feed provides a return path for the power.

13. The plasma source assembly of claim 12, wherein the capacitor is effective to modulate amplitude of a plasma voltage across a length of the RF hot electrode.

14. The plasma source assembly of claim 13, wherein the amplitude modulation is substantially linear from the outer peripheral end to the inner peripheral end of the RF hot electrode.

15. The plasma source assembly of claim 13, wherein the plasma voltage has a node near the inner peripheral end of the RF hot electrode.

16. The plasma source assembly of claim 13, wherein a power dissipation is substantially linear from the outer peripheral end to the inner peripheral end of the RF hot electrode.

17. The plasma source assembly of claim 1, further comprising a return electrode on either side of the RF hot electrode.

18. The plasma source assembly of claim 12, further comprising a return electrode on either side of the RF hot electrode.

* * * * *